(12) United States Patent  
Jensen et al.

(10) Patent No.: US 8,878,296 B1
(45) Date of Patent: Nov. 4, 2014

(54) ELECTROSTATIC DISCHARGE PROTECTION CIRCUITRY

(75) Inventors: Bradley Jensen, San Jose, CA (US); Charles Y. Chu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 978 days.

(21) Appl. No.: 12/910,416

(22) Filed: Oct. 22, 2010

(51) Int. Cl.
*H01L 23/62* (2006.01)

(52) U.S. Cl.
USPC .......................................... 257/355; 257/360

(58) Field of Classification Search
CPC ................... H01L 27/0266; H01L 27/0251
USPC .................................................. 257/355, 360
See application file for complete search history.

(56) References Cited

U.S. PATENT DOCUMENTS

| | | | |
|---|---|---|---|
| 4,939,616 A | 7/1990 | Rountree | |
| 5,239,440 A | 8/1993 | Merrill | |
| 6,889,309 B1 | 5/2005 | Oliveira et al. | |
| 7,772,650 B2 | 8/2010 | Chiang et al. | |
| 2005/0087807 A1* | 4/2005 | Righter | 257/357 |
| 2009/0213508 A1* | 8/2009 | Hsihe et al. | 361/56 |

OTHER PUBLICATIONS

Chu, Charles Y., et al., U.S. Appl. No. 12/405,143, filed Mar. 16, 2009.
Hsu et al., U.S. Appl. No. 12/263,413, filed Oct. 31, 2008.
Perisetty, U.S. Appl. No. 12/052,718, filed Mar. 20, 2008.
Huang et al., U.S. Appl. No. 10/861,604, filed Jun. 3, 2004.

* cited by examiner

*Primary Examiner* — Ha Tran T Nguyen
*Assistant Examiner* — Aaron Dehne
(74) *Attorney, Agent, or Firm* — Treyz Law Group; Jason Tsai

(57) ABSTRACT

Integrated circuits with electrostatic discharge (ESD) protection circuitry are provided. The ESD protection circuitry does not include polysilicon resistors. The ESD protection circuitry may include n-channel transistors coupled in parallel between an output node that is connected to an input/output pin and a ground terminal. The n-channel transistors may each have a drain terminal that is coupled to the output node through first metal paths and a source terminal that is coupled to the ground terminal through second metal paths. The first and second metal paths may be routed over gate terminals of the respective n-channel transistors to provide sufficient resistance. The first and second metal paths may provide desired pull-down resistance in the ESD protection circuitry so that the ESD protection circuitry can sink sufficient current through each of the n-channel transistors to protect internal circuitry from damage in an ESD event.

16 Claims, 8 Drawing Sheets

ELECTROSTATIC DISCHARGE PROTECTION CIRCUITRY

BACKGROUND

This invention relates to electrostatic discharge protection, and more particularly, to circuitry for protecting circuits from damage due to electrostatic discharge events.

Integrated circuits are often exposed to potentially damaging electrostatic charges. For example, a wafer of integrated circuits may be exposed to electric charges during fabrication. Such charges may arise from the use of plasma etching techniques or other processes that produce charged particles. As another example, a packaged integrated circuit may be exposed to electrostatic charges when a worker inadvertently touches exposed pins on the circuit's package or when the package becomes charged electrostatically due to movement of the package in a tray.

These electrostatic charges can damage sensitive circuitry on the integrated circuit. For example, transistors and other electrical devices on an integrated circuit can be damaged when exposed to excessive currents.

To reduce the impact of electrostatic charges on sensitive circuitry, integrated circuits may be provided with electrostatic discharge protection circuitry. Conventional electrostatic discharge protection circuitry includes polysilicon resistors that provide desired resistance values. As integrated devices scale towards more advanced technology nodes (i.e., 28 nm and beyond complementary metal-oxide-semiconductor processes), fabrication design rules impose restrictions on the arrangement of polysilicon resistors. As a result, polysilicon resistors formed in such integrated circuits may provide excessively high resistance values and may therefore not be capable of providing adequate electrostatic discharge protection.

It would therefore be desirable to provide improved circuitry for protecting integrated circuits from the harmful effects of electrostatic discharge.

SUMMARY

Integrated circuits may include electrostatic discharge (ESD) protection circuitry. ESD protection circuits may be part of output driver circuitry that is used to drive signals off-chip.

An ESD protection circuit may be associated with a respective input-output pin through which current may flow into an integrated circuit device during electrostatic discharge events. The ESD protection circuit may include multiple n-channel transistors coupled in parallel between an output node and a ground terminal. The output node may be connected to an input/output (I/O) pin that is associated with that ESD protection circuit. The n-channel transistors may be formed in a substrate (e.g., a silicon substrate).

Each n-channel transistor in the ESD protection circuit may have a gate, a drain terminal that is coupled to the output node through a first set of metal paths, and a source terminal that is coupled to the ground terminal through a second set of metal paths. The first and second set of metal paths provide desired resistance in a pull-down current path of the ESD protection circuit so that sufficient current may flow through the ESD protection circuitry without damaging internal sensitive circuitry on the device.

The ESD protection circuit may be formed without the use of polysilicon resistors. Adjacent n-channel transistors in the ESD protection circuit may share dummy structures that are used to satisfy density requirements. The ESD protection circuit may be formed without the use of resistive polysilicon masks (sometimes referred to as silicide block masks), because the metal paths are capable of providing sufficient pull-down resistance.

In one suitable arrangement, the n-channel transistors in the ESD protection circuit are mirrored with respect to one another (e.g., drain diffusion regions of adjacent n-channel transistors are only separated by a single dummy polysilicon structure, whereas source diffusion regions of adjacent n-channel transistors are only separated by a single dummy polysilicon structure). In this mirrored configuration, the drain terminals of two adjacent n-channel transistors may be shorted together using a first set of metal paths formed in an M1 metal routing layer (e.g., a metal routing layer that is closest to the substrate), whereas the source terminals of two adjacent n-channel transistors may be shorted together using a second set of metal paths. The metal paths in the first set of metal paths may be routed (folded) over the gates of the two adjacent transistors that have their drain terminals connected. The metal paths in the second set of metal paths may be routed (folded) over the gates of the two adjacent transistors that have their source terminals shorted together. The first set of metal paths may be shorted using metal routing at higher metal routing layers (e.g., metal routing layers above the M1 metal layer). The second set of metal paths may be shorted using metal routing at the higher metal routing layers. Forming metal paths using this interweaved metal routing arrangement may provide desired pull-down resistance for the ESD protection circuit.

In another suitable arrangement, the n-channel transistors in the ESD protection circuit are not mirrored with respective to one another (e.g., the drain diffusion region of a given transistor and the source diffusion region of an adjacent transistor are separated by a single dummy structure). In this non-mirrored configuration, a first set of metal paths may connect to the drain diffusion region of a given transistor, while a second set of metal paths may connect to the source diffusion region of the given transistor. The metal paths in the first and second set of metal paths may be routed (folded) over the gate terminal of the given transistor. The first set of metal paths may be shorted using metal routing at higher metal routing layers. The second set of metal paths may be shorted using metal routing at the higher metal routing layers. Forming metal paths using this folded metal routing arrangement may provide desired pull-down resistance for the ESD protection circuit.

Further features of the present invention, its nature and various advantages will be more apparent from the accompanying drawings and the following detailed description.

DETAILED DESCRIPTION

Integrated circuits are often exposed to electrostatic charges. For example, if a person inadvertently touches the input-output (I/O) pins of an integrated circuit, the devices within the integrated circuit may be exposed to electrostatic charge through the person's skin. Electrostatic charges may also develop during integrated circuit fabrication or during handling.

Large currents that develop during an electrostatic discharge event may damage circuitry on the integrated circuit. For example, the human body can discharge as much as 1.5 A of current through an I/O pin of an integrated circuit, whereas undesired electrostatic charges developed during processing, testing, handling, and operation can develop as much as 8 A of current through an I/O pin.

This relates to ways of protecting integrated circuits from the undesirable effects of electrostatic discharge, and in particular, to circuitry for preventing sensitive circuitry and devices from being damaged due to exposure to undesirably high voltages and currents. This may be used to protect circuits formed from any suitable integrated circuit components such as transistors, diodes, resistors, capacitors, inductors, etc.

Figure 1:
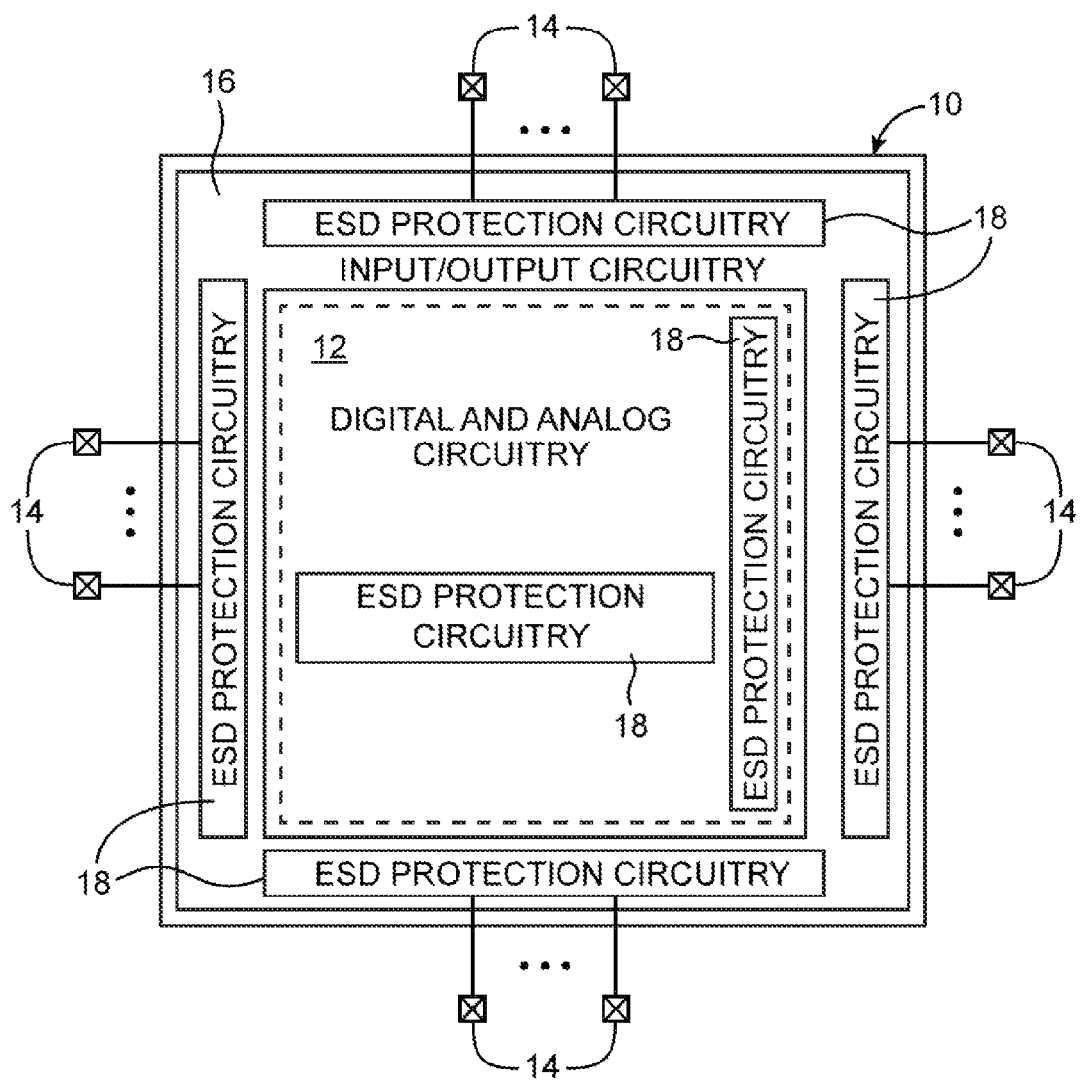
FIG. 1 is a diagram of an illustrative integrated circuit with electrostatic discharge protection circuitry in accordance with an embodiment of the present invention.

FIG. 1 shows an integrated circuit that includes digital and analog circuitry 12 and other circuitry formed in a substrate. The substrate may, for example, be a p-type silicon substrate. Integrated circuit 10 may include memory chips, digital signal processing circuits, microprocessors, application specific integrated circuits, programmable integrated circuits, or other suitable integrated circuits.

As shown in FIG. 1, integrated circuit 10 may include input/output (I/O) circuitry such as I/O circuitry 16 formed along each edge of integrated circuit 10. Circuitry 16 may be used for driving signals off of device 10 and for receiving signals from other devices via I/O pins 14.

Circuitry 16 may include electrostatic discharge (ESD) protection circuitry such as ESD protection circuitry 18 and other I/O circuits that allow integrated circuit 10 to communicate with external (off-chip) components through pins 14. ESD protection circuitry 18 may serve to limit the amount of electrostatic (noise) current that flows through pins 14. Limiting the amount of current that can flow into device 10 through pins 14 may protect sensitive circuitry (e.g., digital and analog circuitry 12) on device 10 from damage due to electrostatic discharge events. ESD protection circuitry 18 may therefore sometimes be referred to an ESD clamp circuit. As shown in FIG. 1, stripes of ESD protection circuitry 18 may also be formed at the core (e.g., near the center and interlaced with circuitry 12) of device 10.

Figure 2:
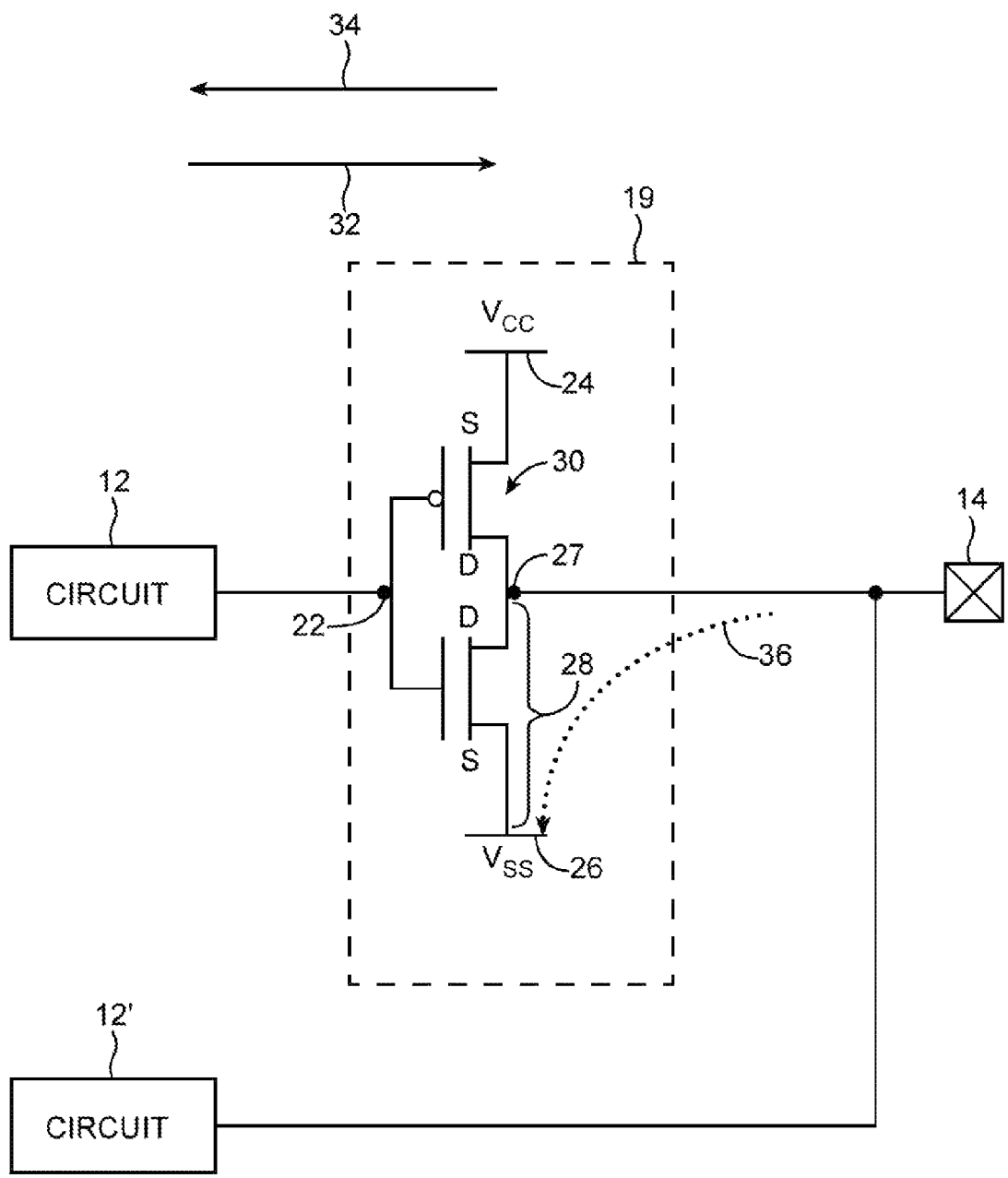
FIG. 2 is a circuit diagram of an illustrative electrostatic discharge protection circuit that is part of an integrated circuit output driver in accordance with an embodiment of the present invention.

FIG. 2 is a circuit diagram showing an ESD protection circuit 28. In the example of FIG. 2, circuit 12 represents sensitive internal circuitry on integrated circuit 10. Circuit 19 may be an inverter that serves as an output driver for circuit 12. Inverter 19 may include a p-channel metal-oxide-semiconductor (PMOS) transistor such as transistor 30 and an n-channel metal-oxide-semiconductor (NMOS) transistor such as transistor 28. Transistor 28 may serve as an ESD protection circuit. Inverter 19 may be powered by a positive power supply voltage Vcc received at positive power supply terminal 24 and a ground voltage Vss received at ground power supply terminal 26.

During normal operation, circuits 12 may supply output signals to node 22 (i.e., an input of inverter 19 that is connected to the gates of transistors 28 and 30). Inverter 19 may invert the output signals provided at node 22 to generate an inverted version of the output signals at output node 27. The inverted output signals provided at node 27 may be fed to external equipment through pin 14 in the direction indicated by arrow 32 (see, e.g., FIG. 2).

As shown in FIG. 2, additional circuitry such as circuit 12' may also be connected to output node 27. Signals supplied by circuit 12' may be fed to external equipment through pin 14.

Circuit 28 may serve to function as an ESD protection circuit. For example, electrostatic charge generated during processing, testing, handling, and other operations may cause undesirable amounts of current to flow into device 10 through pin 14 in the direction indicated by arrow 34. This undesired ESD current may be "absorbed" by circuit 28 (e.g., the undesired current may flow through NMOS transistor 28 without damaging transistor 28 and circuit 12, as indicated by pull-down current path 36). The design of this pull-down current path (e.g., a path between pin 14 and ground terminal 26) may determine whether circuit 28 is capable of sinking sufficient current to protect circuit 12 from damage during an ESD event.

Device 10 may have more than one output driver 19. There may be an output driver 19 that is associated with each I/O pin 14. Circuits 28 in the respective output drivers 19 may collected be referred to as ESD protection circuitry 18 (FIG. 1).

Figure 3:
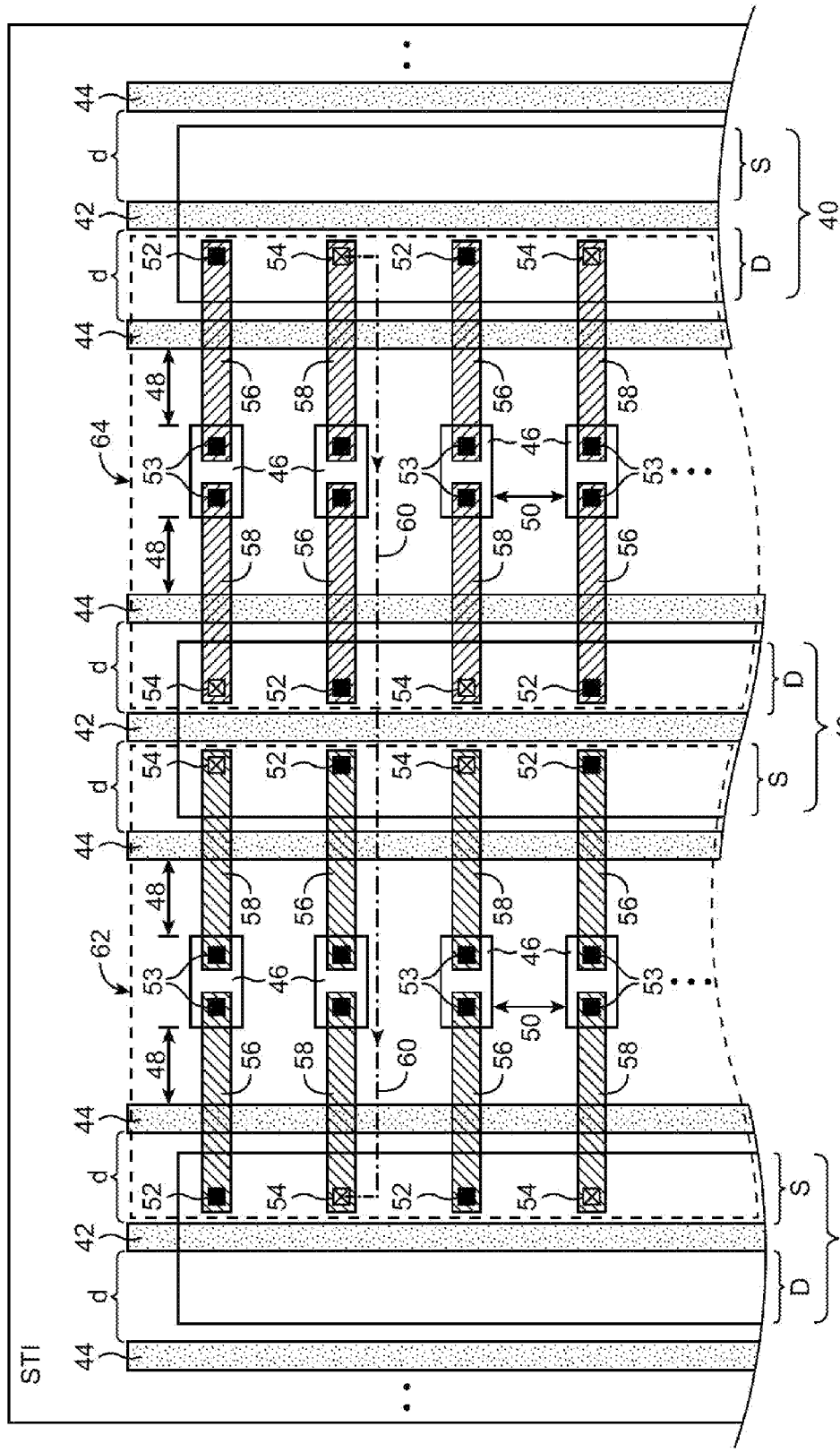
FIG. 3 is a top view of conventional electrostatic discharge circuitry having polysilicon resistors.

FIG. 3 is a top view of conventional ESD protection circuitry. As shown in FIG. 3, the conventional ESD protection circuitry includes NMOS transistors 40 that are connected in parallel. Each NMOS transistor 40 includes gate 42, drain terminal region D, and source terminal region S. Any region in the substrate that is not a part of transistor 40 has shallow trench isolation (STI) structures formed in the surface of the substrate (e.g., any region that is not an oxide diffusion region or a transistor channel region is an STI region).

For each transistor 40, dummy polysilicon gate structures 44 (sometimes referred to as "ghost" polysilicon) are formed at a distance d away from gate 42 and are parallel to gate 42. Each transistor 40 has its own set of dummy structures 44 that are associated with that particular transistor. Polysilicon (poly) resistors 46 are formed in a region between each pair of adjacent transistors 40.

The drain terminal of transistor 40 is connected to a first set of poly resistors 46 through respective metal paths 56. Metal paths 56 are formed in an M1 metal routing layer (i.e., a metal routing layer that is closest to the substrate in an integrated circuit dielectric stack). In particular, each metal path 56 has a first terminal that connects to the drain terminal of transistor 40 through oxide diffusion region contact 52 and a second terminal that connects to a first terminal of associated poly resistor 46 through poly-M1 contact 53 (i.e., a contact that connects polysilicon structures formed on the substrate to metal paths formed in the M1 metal routing layer).

Each poly resistor 46 in the first set of poly resistors is connected to metal strip (plate) 64 formed in an M2 metal routing layer (e.g., a metal routing layer formed above the M1 metal routing layer) through metal path 58. Metal path 58 is formed in the M1 metal routing layer. Plate 64 is formed over the drain diffusion regions of two adjacent transistors 40 (see, e.g., FIG. 3). In particular, each metal path 58 has a first terminal that connects to a second terminal of associated poly resistor 46 through poly-M1 contact 53 and a second terminal that connects to metal strip 64 through M1-M2 via 54 (i.e., a metal via that connects metal paths formed in the M1 metal routing layer to metal paths formed in the M2 metal routing layer).

The source terminal of each transistor 40 is coupled to metal strip 62 using a similar routing configuration. The source terminal of transistor 40 is connected to a second set of poly resistors 46 through metal paths 56. In particular, each metal path 56 has a first terminal that connects to the source terminal of transistor 40 through oxide diffusion region contact 52 and a second terminal that connects to a first terminal of associated poly resistor 46 through poly-M1 contact 53.

Each poly resistor 46 in the second set of poly resistors is connected to metal strip 62 (e.g., a metal strip formed in the M2 metal routing layer) through metal path 58. Plate 62 is formed over the source regions of two adjacent transistors 40 (see, e.g., FIG. 3). In particular, each metal path 58 has a first terminal that connects to a second terminal of associated poly resistor 46 through poly-M1 contact 53 and a second terminal that connects to metal strip 62 through M1-M2 via 54.

As shown in FIG. 3, the ESD pull-down current path is indicated by dotted line 60. During an ESD event, current flows through an I/O pin, through poly resistors 46 that are connected to the drain terminals of transistors 40, through transistors 40, through poly resistors 46 that are connected to the source terminals of transistors 40, and into ground.

Poly resistors 46 are used to provide desired resistance values in the pull-down current path. In more advanced technology nodes (e.g., 28 nm and beyond complementary metal-oxide-semiconductor processes), however, fabrication design rules significantly limit the number of poly resistors 46 that can be placed between each pair of adjacent transistors 40. In particular, the poly-to-poly spacing requirements as indicated by arrows 48 and 50 are significantly larger relative to previous technology nodes (e.g., 45 nm CMOS processes). As a result, the area of the conventional ESD protection circuitry will increase drastically and the pull-down current path may suffer from excessive resistance. Pull-down resistance that is too high will not allow the ESD protection circuitry to sink sufficient current in an ESD event. As a result, internal circuitry may suffer from damage.

Figure 4:
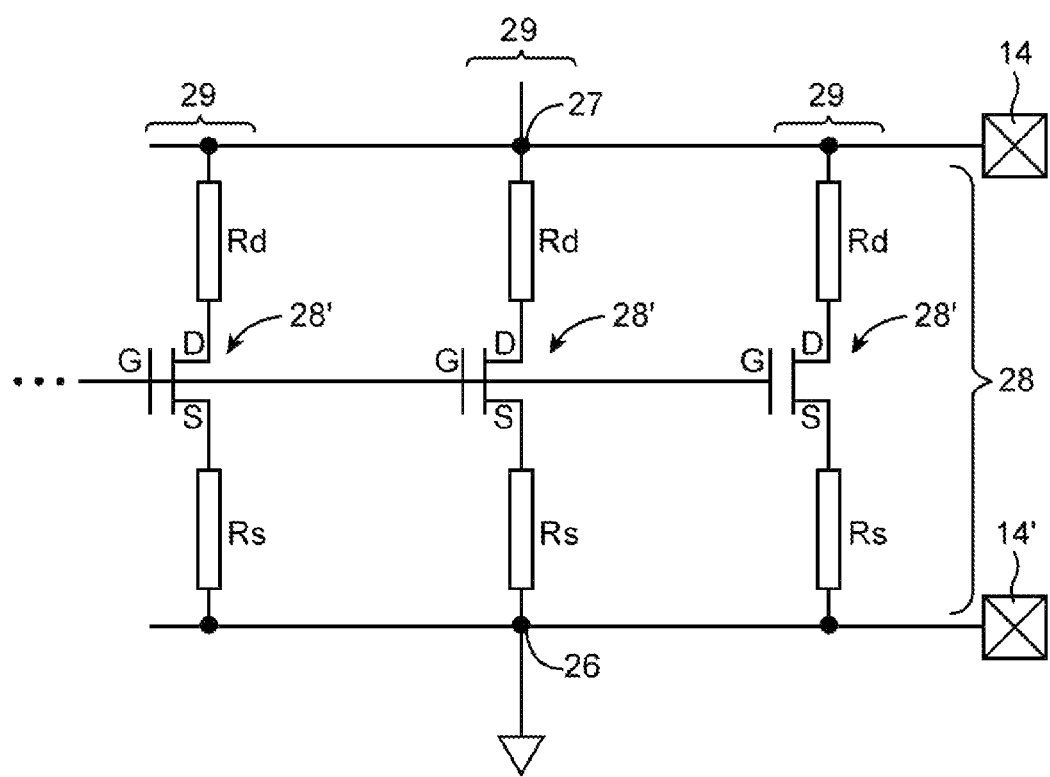
FIG. 4 is a schematic diagram showing an illustrative circuit implementation of electrostatic discharge protection circuitry in accordance with an embodiment of the present invention.

FIG. 4 shows one suitable implementation of ESD protection circuit 28 of FIG. 2. As shown in FIG. 4, ESD protection circuit 28 may include multiple n-channel transistors such as n-channel transistors 28' coupled in parallel. Each transistor 28' may have a source S and a drain D. (Sources S and drains D are sometimes collectively referred to herein as source-drain terminals, source-drains, or source-drain regions.) Transistors 28' may be coupled between output node 27 and ground terminal 26. Node 27 may be connected to pin 14 (e.g., a pin through which ESD current flows into device 10). Ground terminal 26 may be connected to ground pin 14'.

Each transistor 28' in this parallel configuration may be associated with a respective branch 29. Transistor 28' in each branch 29 may have a drain terminal that is coupled to node 27 through a conductive path having a wire resistance value of Rd and a source terminal that is coupled to node 26 through a conductive path having a wire resistance value of Rs. The conductive paths (wires) that connect the drain terminals of transistors 28' to node 27 and that connect the source terminals of respective transistors 28' to node 26 may provide desired resistance values that enable circuit 28 to sink sufficient current during electrostatic discharge events so that circuit 12 on device 10 is protected from damage (e.g., the combined pull-down series resistance of Rd, transistor channel resistance, and Rs in each branch 29 is not too small such that all the ESD current only flows through one branch 29 and is not too large such that ESD protection circuit 28 can still sink sufficient current in a worst-case ESD event). Forming ESD protection circuitry in this way does not require the use of poly resistors.

The example shown in FIG. 4 is merely illustrative. If desired, ESD protection circuit 28 may include more than three transistors 28' or less than three transistors 28' connected in parallel (e.g., circuitry 28 may include any desired number of branches 29). Transistor 28 of FIG. 2 formed by coupling multiple transistors 28' in parallel may sometimes be referred to as having a "multi-finger" configuration.

Figure 5:
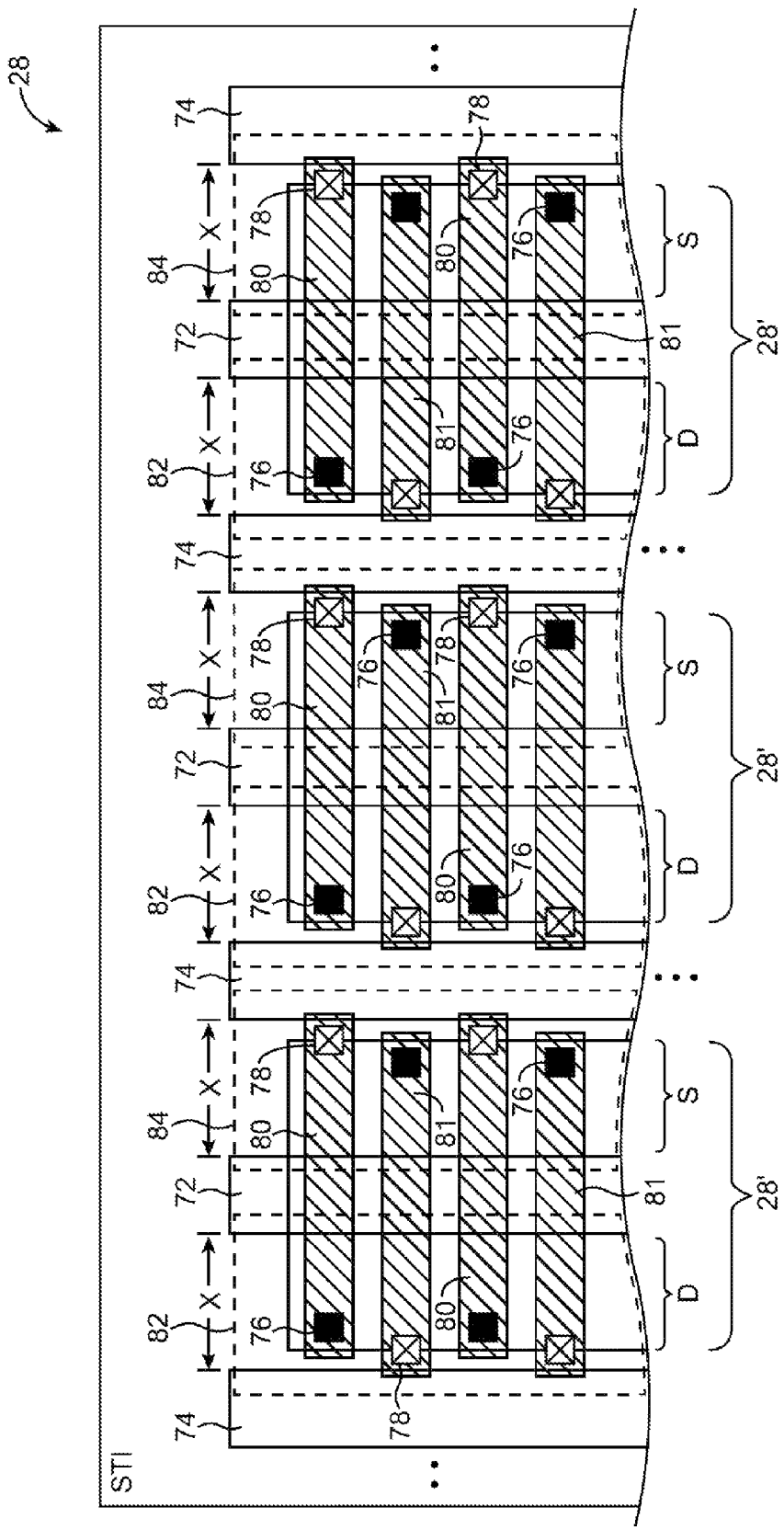
FIGS. 5 and 6 are top views of illustrative electrostatic discharge protection circuitry in accordance with an embodiment of the present invention.

FIG. 5 shows a top view of one suitable arrangement of ESD protection circuit 28 (FIG. 4). As shown in FIG. 5, each n-channel transistor 28' may include a gate such as gate (gate region) 72, a drain terminal region D, and a source terminal region S. Gate region 72 may be interposed between the drain terminal region and the source terminal region associated with a particular transistor 28'. Gate 72 may be a polysilicon gate structure or other suitable conductive gate structures. The drain and source regions may sometimes be referred to as oxide definition regions and may be n+ doping regions (as an example). Regions in the surface of the substrate that are not oxide definition regions and that are not transistor channel regions (e.g., regions directly beneath each gate 72) may have shallow trench isolation (STI) structures formed in the surface of the substrate.

Dummy structures such as dummy structures 74 that are at a distance x away from gate 72 and that are parallel to gate 72 of each transistor 28' may be formed on the substrate. Dummy structures 74 may be formed over STI structures. Dummy structures 74 may be formed from any suitable materials with a density comparable to the density of transistor gate 72 (e.g., a polysilicon gate) or other such structures in surrounding circuitry. Structures 74 may therefore sometimes be referred to as dummy polysilicon structures or ghost polysilicon structures.

For example, dummy structures 72 may be formed using polysilicon to satisfy polysilicon density requirements (i.e., to ensure the density of the ESD protection circuitry substantially match the density of the surrounding circuitry). Density compliance structures such as dummy structures 74 that are used to satisfy density matching requirements may sometimes be referred to as dummy fill structures or dummy gate structures.

As shown in FIG. 5, there may be a single dummy structure 74 formed between each pair of adjacent transistors 28'. The single dummy structure may be referred to as a "shared" dummy structure. Sharing dummy structures 74 in this way may substantially reduce the area of ESD protection circuit 28, because two adjacent transistors 28' may be placed closer together in comparison to configurations in which two adjacent transistors each has its own set of dummy structures 74.

OD-M1 contacts (e.g., oxide definition to M1 metal routing layer contacts) such as contacts 76 may be formed in the drain diffusion region of a given transistor 28'. Conductive paths such as metal paths 80 formed in the M1 metal routing layer may each have a first terminal that is connected to a respective contact 76. Metal paths 80 may be routed (folded) over gate 72 of the given transistor towards the source diffusion region of the given transistor (e.g., metal paths 80 may run across at least some of the drain diffusion region, gate region 72, and source diffusion region). Metal paths 80 may each have a second terminal that is connected to an M1-M2 via such as M1-M2 via 78. Vias 78 may be connected to conductive plate 84 formed over the source diffusion region of the given transistor (see, e.g., FIG. 5). Metal strip 84 may be coupled to pin 14 through which current may flow into device 10 during an ESD event.

Metal paths 80 that couple the drain diffusion region of each transistor 28' to pin 14 using this configuration may collectively exhibit the desired resistance value of Rd described in connection with FIG. 4.

The source diffusion region of each transistor 28' may be coupled to the ground terminal using a similar routing arrangement. OD-M1 contacts 76 may be formed in the source diffusion region of a given transistors 28'. Conductive paths such as metal paths 81 formed in the M1 metal routing layer may each have a first terminal that is connected contact 76 formed in the source diffusion region of the given transistor. Metal paths 81 may be routed over gate 72 of the given transistor towards the drain diffusion region of the given transistor (e.g., metal paths 81 may overlap at least some of the source diffusion region of the given transistor, at least some of gate region 72 of the given transistor, and at least some of the drain diffusion region of the given transistor). Metal paths 81 may each have a second terminal that is connected to M1-M2 via 78. Via 78 may be connected to conductive plate 82 formed over the drain diffusion region of the given transistor (see, e.g., FIG. 5). Metal strip 82 may be coupled to the ground terminal.

Metal paths 81 that couple the source diffusion region of each transistor 28' to the ground terminal using this configuration may collectively exhibit the desired resistance value of Rs described in connection with FIG. 4.

Metal strips 82 formed over the drain diffusion regions of each transistor 28' may be shorted to one another using connections formed in a higher metal routing layer (e.g., using metal wiring in M3, M4, or M5 metal routing layers). Metal strips 84 formed over the source diffusion regions if each transistor 28' may be shorted to one another using connections formed in a higher metal routing layer. Connecting the metal strips using this configuration forms the parallel connection of branches 29 described in connection with FIG. 4.

Routing metal paths 80 and 81 using the intertwined (folded) arrangement as shown in FIG. 5 may provide desired wire resistance values at the drain and source terminals of transistors 28'. Providing the desired wire resistance values at the drain and source terminals of transistors 28' may enable ESD protection circuit 28 to sink sufficient current without flowing all the ESD current through only one of transistors 28' (e.g., a portion of the ESD current may desirably flow through each branch 29 into the ground terminal without causing damage to sensitive internal circuitry 12).

Transistors 28' of FIG. 5 are not mirrored with respect to one another. For example, the drain diffusion region of a first transistor 28' is adjacent to the source diffusion region of a second transistor 28' that is adjacent to the first transistor (e.g., the drain diffusion region of the first transistor is to the left of gate 72 of the first transistor while the drain diffusion region of the second transistor is also to the left of gate 72 of the second transistor). The drain diffusion region of the first transistor and the source diffusion region of the second transistor may be separated by dummy structure 74.

In the arrangement of FIG. 5, the metal strips formed in the M2 metal routing layer may be formed over either a source diffusion region or a drain diffusion region. For example, metal strip 82 may be formed over a drain diffusion region of a given transistor 28', whereas metal strip 84 may be formed over a source diffusion region of the given transistor. Metal strip 84 formed over a given source diffusion region may not extend over adjacent diffusion regions, because adjacent diffusion regions are drain diffusion regions that are already covered with metal strips 82. Similarly, metal strip 82 formed over a given drain diffusion region may not extend over adjacent diffusion regions, because adjacent diffusion regions are source diffusion regions that are already covered using metal strips 84. Metal strips 82 and 84 may run perpendicular to metal paths 80 and 81 and may run parallel to gates 72, to the different drain diffusion regions, and to the different source diffusion regions.

Figure 6:
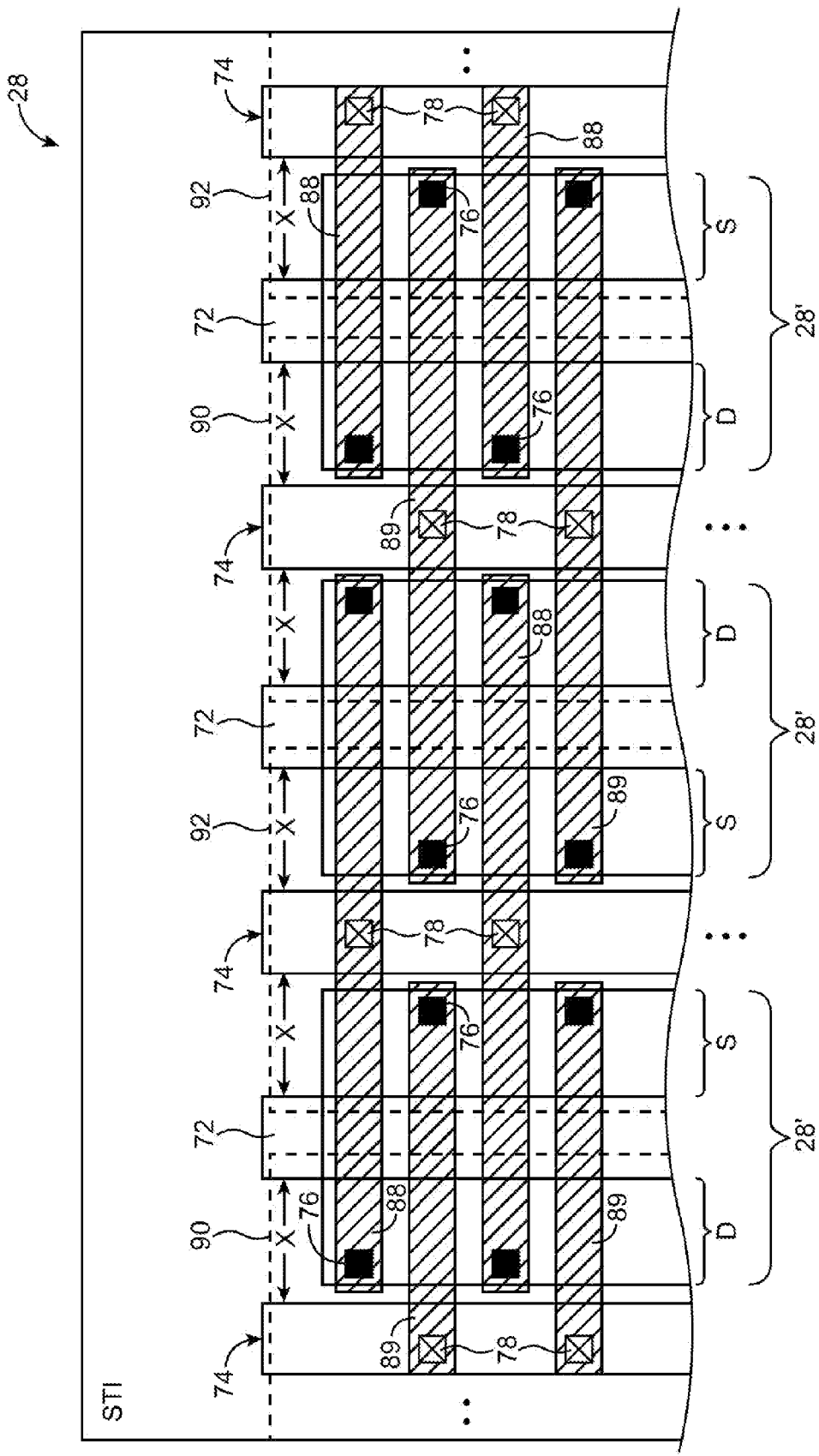

Another suitable arrangement of ESD protection circuit 28 is shown in FIG. 6. As shown in FIG. 6, each re-channel transistor 28' may include gate 72, drain terminal region D, and source terminal region S. Gate 72 may be a polysilicon gate structure or other suitable conductive gate structures. Regions in the surface of the substrate that are not oxide diffusion regions and that are not transistor channel regions (e.g., regions directly beneath each gate 72) may have shallow trench isolation (STI) structures formed in the surface of the substrate.

Dummy structures such as dummy structures 74 that are at a distance x away from gate 72 and that are parallel to gate 72 may be formed on the substrate. Dummy structures 74 are formed over STI structures. A single dummy structure 74 may be shared between two adjacent transistors 28' to reduce the area of ESD protection circuit 28.

Transistors 28' in FIG. 6 mirrored with respect to one another. For example, the drain diffusion region of a first transistor 28' is adjacent to the drain diffusion region of a second transistor 28' that is adjacent to the first transistor (e.g., the drain diffusion region of the first transistor is to the left of gate 72 of the first transistor, whereas the drain diffusion region of the second transistor is to the right of gate 72 of the second transistor). The drain diffusion region of the first transistor and the drain diffusion region of the second transistor may be separated by a dummy structure 74. Similarly, the source diffusion region of the first transistor may be adjacent to the source diffusion region of a third transistor 28' that is adjacent to the first transistor. The source diffusion region of the first transistor and the source diffusion region of the third transistor may be separated by a dummy structure 74.

OD-M1 contacts 76 may be formed in the drain diffusion region of a given transistor 28'. Conductive paths such as metal paths 88 formed in the M1 metal routing layer may each have a first terminal that is connected to respective contact 76. Metal paths 88 may be routed over gate 72 of the given transistor towards the drain diffusion region of another transistor 28' that is adjacent to the given transistor. Metal paths 88 may each have a second terminal that is connected to respective contact 76 formed in the drain diffusion region of the adjacent transistor (see, e.g., FIG. 6).

An M1-M2 via such as M1-M2 via 78 may be formed at an intermediate location along each metal path 88. Via 78 may be connected to conductive plate 92 formed over the source diffusion regions of the two adjacent transistors 28' (e.g., the given transistor and the another transistor that is adjacent to the given transistor). Metal strip 92 may be coupled to pin 14 through which current may flow into device 10 during an ESD event.

Metal paths 88 that couple the drain diffusion region of each transistor 28' to pin 14 using this configuration may collectively exhibit the desired resistance value of Rd described in connection with FIG. 4.

The source diffusion region of each transistor 28' may be coupled to the ground terminal using a similar routing arrangement. OD-M1 contacts 76 may be formed in the source diffusion region of a given transistor 28'. Conductive paths such as metal paths 89 formed in the M1 metal routing layer may each have a first terminal that is connected contact 76 formed in the source diffusion region of the given transistor. Metal paths 89 may each be routed (folded) over gate 72 of the given transistor towards the source diffusion region of another transistor 28' that is adjacent to the given transistor. Metal path 88 may also be folded over gate 72 of the adjacent transistor. Metal path 89 may have a second terminal that is connected to contact 76 formed in the source diffusion region of the adjacent transistor (see, e.g., FIG. 6).

M1-M2 via 78 may be formed at an intermediate location along each metal path 89. Via 78 may be connected to conductive plate 90 formed over the drain diffusion regions of two adjacent transistors (e.g., the given transistor and the another transistor that is adjacent to the given transistor). Metal strip 90 may be coupled to the ground terminal.

Metal paths 89 that couple the source diffusion region of each transistor 28' to the ground terminal using this configuration may collectively exhibit the desired resistance value of Rs described in connection with FIG. 4.

Metal strips 90 formed over the drain diffusion regions may be shorted to one another using metal routing in higher metal routing layers, whereas metal strips 92 formed over the source diffusion regions may be shorted to one another using metal routing in higher metal routing layers. Connecting the metal strips using this approach forms the parallel connection of branches 29 described in connection with FIG. 4.

Routing metal paths 88 and 89 using the interweaved arrangement as shown in FIG. 6 may provide desired wire resistance values at the drain and source terminals of transistors 28'. Providing the desired wire resistance values at the drain and source terminals of transistors 28' may enable ESD protection circuit 28 to sink sufficient current without flowing all the current through only one of transistors 28'. Flowing ESD current through only one transistor 40 in this way may undesirable destroy that transistor, resulting in inoperable ESD protection circuitry.

In the arrangement of FIG. 6, metal strips formed in the M2 metal routing layer may be formed over either the drain diffusion regions of two adjacent transistors 28' or over the source diffusion regions of two adjacent transistors 28'. Metal strip 92 formed over the source diffusion regions of two adjacent transistors 28' may not extend over adjacent diffusion regions, because adjacent diffusion regions are drain diffusion regions that already have metal strips 90 formed over them. Similarly, metal strip 90 formed over the drain diffusion regions of two adjacent transistors 28' may not extend over adjacent diffusion regions, because adjacent diffusion regions are source diffusion regions that already have metal strips 92 formed over them. Metal strips 90 and 92 may run perpendicular to metal paths 88 and 89 and may run parallel to gates 72.

FIGS. 5 and 6 are merely illustrative configurations of the ESD protection circuitry. If desired, other suitable transistor orientations or metal routing configurations may be used to provide desired pull-down resistance values.

Metal paths/plates 80, 81, 82, 84, 88, 89, 90, and 92 are paths formed from strips of conductors such as elongated rectangular metal regions.

Figure 7:
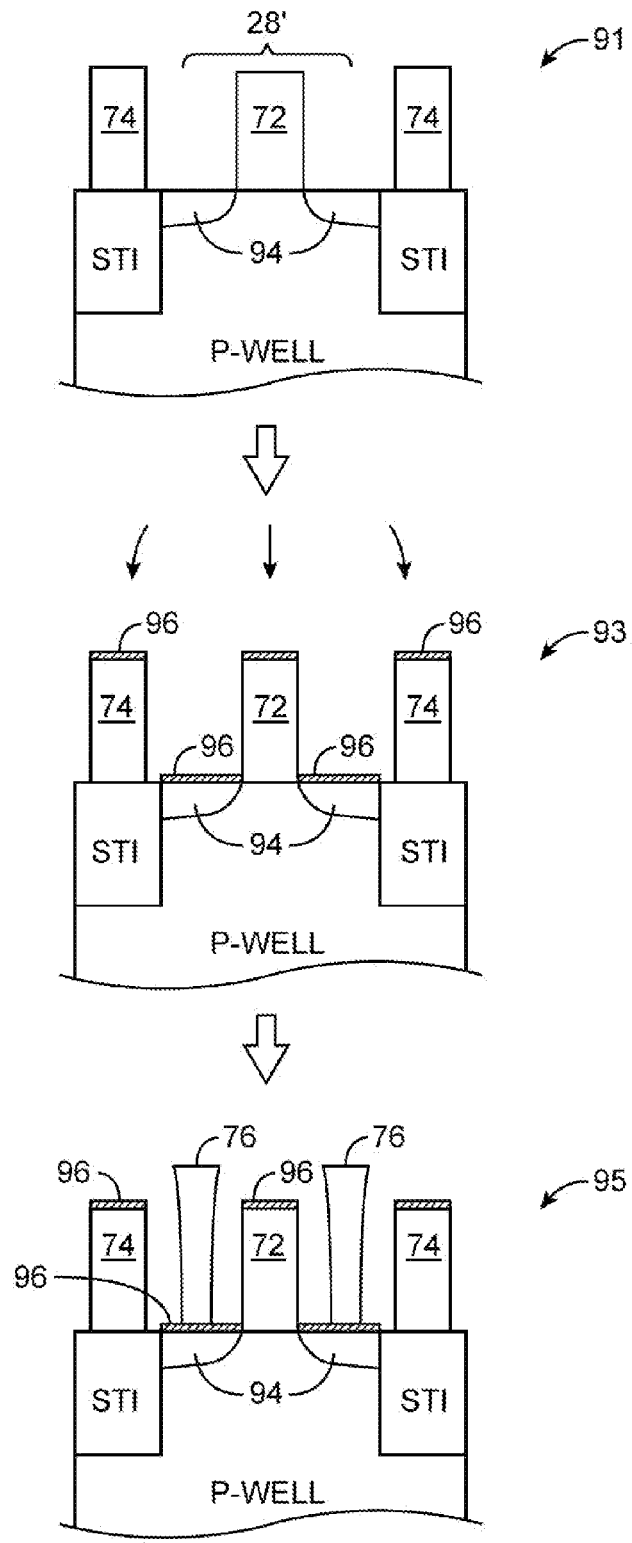
FIG. 7 is a diagram showing illustrative steps involved in forming the electrostatic discharge protection circuitry of FIGS. 5 and 6 in accordance with an embodiment of the present invention.

FIG. 7 shows fabrication steps involved in forming transistor 28'. Transistor 28' may have gate 72 formed over the substrate (e.g., a p-well formed in the substrate) and source-drain diffusion regions 94. Regions in the surface of the substrate that are not part of transistor 28' may include STI regions. Dummy gate structures 74 may be formed over the STI structures that separate a pair of adjacent transistors 28' (step 91).

At step 93, silicide 96 may be deposited over the wafer on which transistors 28' are formed. The source and drain diffusion regions 94 may be entirely covered with silicide to lower contact resistance. Silicide 96 may be deposited using the salicide process (e.g., a self-aligned deposition process), chemical deposition, physical deposition, or other types of deposition processes. Resistive polysilicon (RPO) masks (sometimes referred to as silicide block masks) need not be used. At step 95, OD-M1 contacts 76 that contact the source-diffusion regions 94 of transistor 28' may be formed.

In conventional ESD protection circuits, resistive polysilicon masks are required to mask certain portions of the ESD protection circuitry. Masking portions of the ESD protection circuitry prevents formation of silicide, thereby increasing the resistance of metal conductors that contact the diffusion regions. Increasing the contact resistance using silicide block masks is necessary in conventional ESD protection circuitry to provide sufficient series resistance in the pull-down current path.

Figure 8:
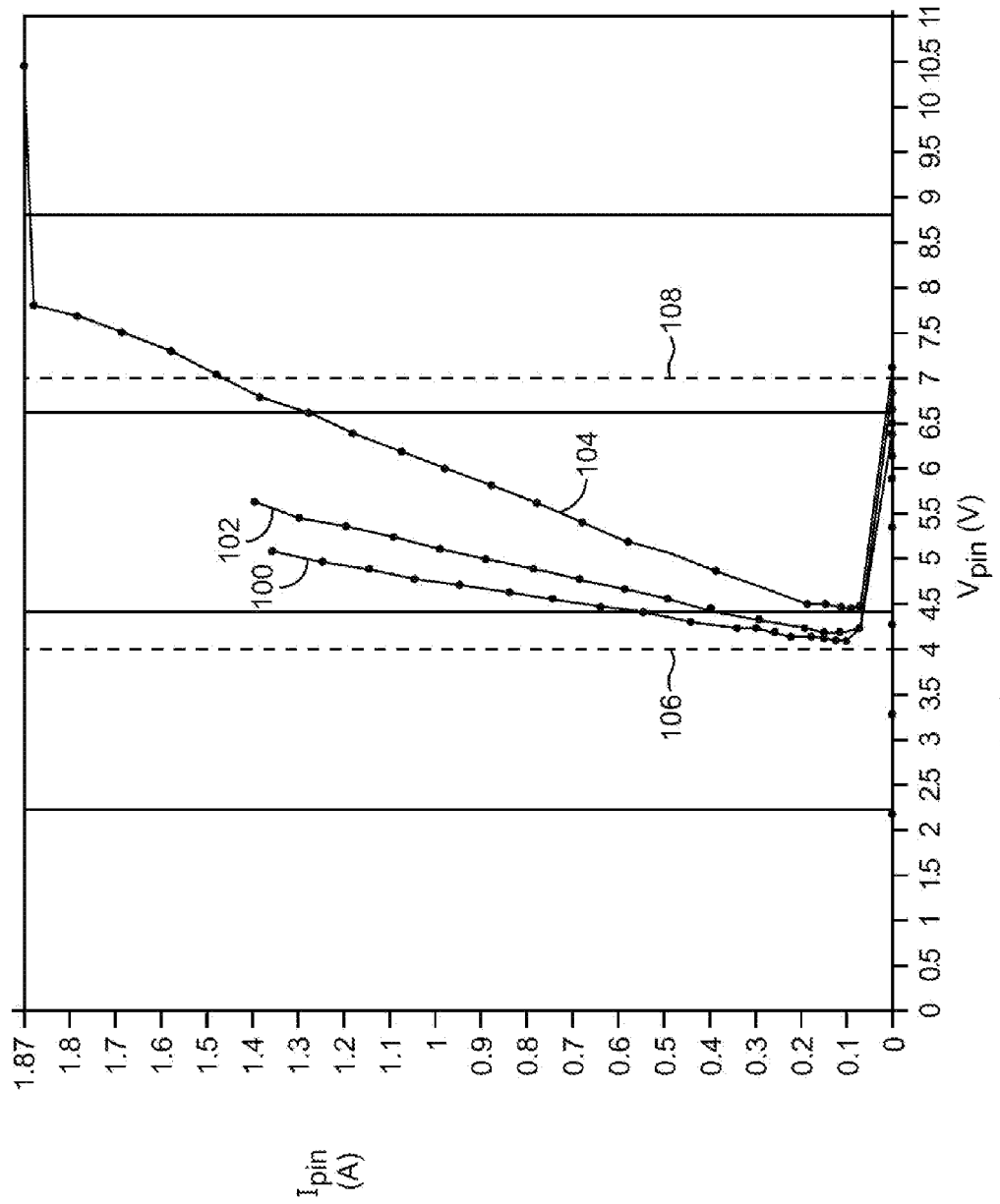
FIG. 8 is a graph illustrating how current flowing through an input/output pin may vary as a function of voltage at the input/output pin in accordance with an embodiment of the present invention.

FIG. 8 is a graph showing current (Ipin) that can flow into device 10 through pin 14 as a function of pin voltage (Vpin). Curves 100, 102, and 104 are three separate characteristic curves representing the behavior of properly designed ESD protection circuitry, each reflecting distinct resistive values in the ESD pull-down current path. For example, curve 100 may represent the characteristic I-V (current versus voltage) behavior of ESD protection circuit having a first pull-down resistance value. Curve 102 may represent the characteristic I-V behavior of ESD protection circuitry having a second pull-down resistance value that is greater than the first pull-down resistance value. Curve 104 may represent the characteristic I-V behavior for the ESD protection circuitry having a third pull-down resistance value that is greater than the second pull-down resistance value.

ESD protection circuit 28 may be designed to be capable of withstanding at least 7 V of electrostatic charge to satisfy design criteria. For example, curve 104 shows that ESD protection circuit 28 can sink up to 1.4 A of current in the event of a 7 V electrostatic discharge (see, e.g., dotted line 108 in FIG. 8). Designing pull-down current paths having resistance values that are too high may cause this peak current to drop undesirably.

Curves 100, 102, and 104 also exhibit positive slopes for higher current levels (e.g., for Ipin greater than 0.1 A). This positive slope reflects the capability of circuit 28 to sink current through different parallel resistive pull-down branches 29 (FIG. 4). Designing pull-down current paths having resistance values that are too low may cause the slope at higher current levels to be negative. A negative slope in the I-V characteristic curve at higher current levels may result in a scenario in which ESD current only flows through one of pull-down branches 29. Flowing large amounts of current through one of branches 29 may destroy the ESD protection circuitry and result in circuit malfunction.

The pull-down current paths in circuit 28 may exhibit desired resistance values (e.g., resistance values that are not too small nor too large) so that ESD protection circuit 28 can sink sufficient current through the different pull-down branches 29 and so that the internal sensitive circuitry of device 10 remains undamaged in the event of an electrostatic discharge.

The foregoing is merely illustrative of the principles of this invention and various modifications can be made by those skilled in the art without departing from the scope and spirit of the invention.

What is claimed is:

1. Circuitry, comprising:
   a transistor having a source region, a drain region, and a gate region formed on a substrate;
   a first plurality of conductive strips each of which is connected to the drain region and each of which runs across at least some of the source region, drain region, and gate region;
   a second plurality of conductive strips that is interleaved with the first plurality of conductive strips, wherein each of the second plurality of conductive strips is connected to the source region and each of the second plurality of conductive strips runs across at least some of the source region, drain region, and gate region; and
   a dielectric stack formed over the substrate, wherein the dielectric stack includes alternating metal routing layers and via layers, and wherein the first and second pluralities of conductive strips are formed in the same metal routing layer in the dielectric stack.

2. The circuitry defined in claim 1, wherein the transistor comprises an n-channel transistor, the circuitry further comprising a p-channel transistor, wherein the n-channel transistor and p-channel transistor are connected in series between a positive power supply terminal and a ground terminal and form an inverter with an output.

3. The circuitry defined in claim 2 further comprising an input-output pin to which the output is connected.

4. The circuitry defined in claim 3, wherein the drain region is entirely covered with silicide and wherein the source region is entirely covered with silicide.

5. Electrostatic discharge protection circuitry, comprising:
   a first transistor source-drain region;
   a second transistor source-drain region;
   a gate region interposed between the first transistor source-drain region and the second transistor source-drain region, wherein the first and second transistor source-drain regions and the gate region form parts of a transistor; and
   a conductive path that is electrically connected to the first source-drain region and that overlaps at least some of the first transistor source-drain region, at least some of the second transistor source-drain region, and at least some of the gate region, wherein the conductive path includes a first strip of conductor that runs across at least some of the first and second source-drain regions and the gate region and a second strip of conductor that runs perpendicular to the first strip of conductor, and wherein the first strip of conductor has a first end that is coupled to the first source-drain region and a second end that is coupled to the second strip of conductor using only one conductive via.

6. The electrostatic discharge protection circuitry defined in claim 5, wherein the first and second strips of conductor are formed in different metal routing layers in an integrated circuit dielectric stack.

7. The electrostatic discharge protection circuitry defined in claim 5, wherein the conductive path includes at least one additional via coupling the first source-drain region to the second strip of conductor.

8. The electrostatic discharge protection circuitry defined in claim 7, wherein the first strip of conductor comprises one of a plurality of parallel strips of conductor each of which runs across at least some of the first and second source-drain regions and the gate region and each of which is connected to the second strip of conductor using a respective via.

9. The electrostatic discharge protection circuitry defined in claim 5 further comprising a third source-drain region, a fourth source-drain region, and an additional gate region that form part of an additional transistor, wherein the conductive path overlaps at least some of the third transistor source-drain region, at least some of the fourth transistor source-drain region, and at least some of the additional gate region.

10. The electrostatic discharge protection circuitry defined in claim 9 further comprising a dummy gate region interposed between the transistor and the additional transistor, wherein the conductive path runs across the dummy gate region.

11. The electrostatic discharge protection circuitry defined in claim 5 further comprising an additional conductive path that includes a third strip of conductor that runs across at least some of the first and second source-drain regions and the gate region and a fourth strip of conductor that runs perpendicular to the third strip of conductor.

12. The electrostatic discharge protection circuitry defined in claim 11 further comprising:
    an input-output pin, wherein the conductive path is electrically connected to the input-output pin.

13. The electrostatic discharge protection circuitry defined in claim 12 further comprising:
    a ground terminal, wherein the additional conductive path is electrically connected to the ground pin.

14. Circuitry, comprising:
    a circuit having an output;
    an integrated circuit input-output pin;
    an inverter connected between the input-output and the integrated circuit input-output pin, wherein the inverter includes a p-channel transistor and an n-channel transistor connected in series, wherein the n-channel transistor comprises a drain region, a source region, and a gate region, and wherein the inverter comprises at least one strip of conductor that overlaps the drain region, the source region, and the gate region; and
    a dummy gate formed over shallow trench isolation structures, wherein the at least one strip of conductor passes over the dummy gate.

15. The circuitry defined in claim 14, wherein the strip of conductor comprises one of a first set of parallel strips of conductor each of which overlaps the drain region, the source region, and the gate region and each of which is connected to the drain region, the circuitry further comprising a second set of parallel strips of conductor each of which overlaps the drain region, the source region, and the gate region and each of which is connected to the source region.

16. The circuitry defined in claim 15 further comprising a first conductive line that runs parallel to the drain region and overlaps the drain region and a second conductive line that runs parallel to the source region and overlaps the source region, wherein each of the strips of conductor in the first set of parallel strips of conductor is connected to the first conductive line and wherein each of the strips of conductor in the second set of parallel strips of conductor is connected to the second conductive line.

* * * * *